United States Patent
Gavillero

(10) Patent No.: US 11,316,444 B2
(45) Date of Patent: Apr. 26, 2022

(54) CHARGE PUMP CIRCUIT AND METHOD FOR VOLTAGE CONVERSION

(71) Applicant: ams AG, Premstätten (AT)

(72) Inventor: Juan Miguel Gavillero, Eindhoven (NL)

(73) Assignee: AMSAG, Premstätten (AT)

( * ) Notice: Subject to any disclaimer, the term of this patent is extended or adjusted under 35 U.S.C. 154(b) by 0 days.

(21) Appl. No.: 17/050,090

(22) PCT Filed: Mar. 27, 2019

(86) PCT No.: PCT/EP2019/057735
§ 371 (c)(1),
(2) Date: Oct. 23, 2020

(87) PCT Pub. No.: WO2019/206550
PCT Pub. Date: Oct. 31, 2019

(65) Prior Publication Data
US 2021/0099101 A1      Apr. 1, 2021

(30) Foreign Application Priority Data
Apr. 26, 2018    (EP) .................................. 18169480

(51) Int. Cl.
*H02M 7/797* (2006.01)
*H02M 1/088* (2006.01)

(52) U.S. Cl.
CPC ........... *H02M 7/797* (2013.01); *H02M 1/088* (2013.01)

(58) Field of Classification Search
CPC .... H02M 7/797; H02M 1/088; H02M 1/0087; H02M 3/337; H02M 2001/0087; H03F 2203/30006; H03F 3/3071; H03F 1/307; H03F 3/211; H03K 19/01812; G06F 13/01812; G06F 13/4072
(Continued)

(56) References Cited

U.S. PATENT DOCUMENTS 4,439,743 A * 3/1984 Schwarz ............... H03F 1/3205
330/267
4,803,481 A   2/1989 Mueller et al.
(Continued)

FOREIGN PATENT DOCUMENTS

| DE | 202016104342 U1 | 11/2017 |
|---|---|---|
| EP | 1324347 A1 | 7/2003 |
| JP | 2001345868 A | 12/2001 |

OTHER PUBLICATIONS

Received STIC search report from EIC 2800 searcher Salim Alam on Sep. 27, 2021 for claim 1. (Year: 2021).*
(Continued)

*Primary Examiner* — Shawki S Ismail
*Assistant Examiner* — Htet Z Kyaw
(74) *Attorney, Agent, or Firm* — MH2 Technology Law Group LLP

(57) ABSTRACT

An inverter circuit arrangement that connects an IO-link master with a slave includes an AB class transistor circuit of which the currents are replicated by a current mirror to a terminal of the slave. A bias circuit provides bias voltages to the AB class transistors. A comparator forms a feedback between the master and slave terminals. The circuit provides for a bidirectional inversion to make a slave device IO-link compatible.

12 Claims, 2 Drawing Sheets

(58) Field of Classification Search
USPC .......................................................... 363/131
See application file for complete search history.

(56) References Cited

U.S. PATENT DOCUMENTS

| | | | |
|---|---|---|---|
| 5,349,287 A | | 9/1994 | Lorenz |
| 5,477,185 A | * | 12/1995 | Jouen ........................ H03F 1/32 |
| | | | 327/363 |
| 5,734,293 A | | 3/1998 | Gross |
| 6,374,043 B1 | * | 4/2002 | El-Sherif ............... G11B 5/022 |
| | | | 318/567 |
| 2005/0040878 A1 | | 2/2005 | Garrett Jr. et al. |
| 2008/0106245 A1 | * | 5/2008 | Aizawa ................... G05F 1/573 |
| | | | 323/277 |
| 2010/0188789 A1 | | 7/2010 | Satake et al. |
| 2015/0372680 A1 | * | 12/2015 | Confalonieri .... H03K 19/01714 |
| | | | 326/81 |

OTHER PUBLICATIONS

Received STIC search report from EIC 2800 searcher Steve Chung, Chickasaw on Sep. 27, 2021 for claim 13. (Year: 2021).*
International Search Report and Written Opinion dated Oct. 31, 2019 in PCT Application No. PCT/EP2019/057735, 10 pages.

* cited by examiner

CHARGE PUMP CIRCUIT AND METHOD FOR VOLTAGE CONVERSION

The present application is a national stage entry of International Patent Application No. PCT/EP2019/057735, filed on Mar. 27, 2019, published as International Publication No. WO 2019/206550 A1 on Oct. 31, 2019, and claims priority under 35 U.S.C. § 119 from European Patent Application No. 18169480.3 filed on Apr. 26, 2018, all of which are hereby incorporated by reference in their entirety for all purposes.

TECHNICAL FIELD

The present disclosure relates to a circuit arrangement that provides a bidirectional inverter function. Specifically, the present disclosure relates to a circuit arrangement that provides a bidirectional inversion between first and second terminals useful to connect a master circuit according to European norm EN 61131 part 9 with a slave circuit that does not comply with that norm.

BACKGROUND

European norm EN 61131 part 9, also often called IO-link, concerns requirements useful to connect a slave device to a master device over a cable having at least three wires in an industrial environment. The slave is often a sensor or an actuator that interfaces with the master over the peer-to-peer communication of the IO-link, wherein the master may be inserted in the field bus of a higher level control system. The IO-link master includes switchable current sources in push-pull configuration and the IO-link slave includes a switchable high side current source such as an open collector PNP transistor. A current signal is transmitted over a signal line in that the master or the slave supply a high side current over the open collector PNP transistors or the master sinks a pull down current through the pull down resistor.

There are sensor devices available on the market that use a low side current switch such as an open collector NPN transistor rather than a high side current switch so that these sensor devices are not IO-link compatible and cannot immediately communicate to IO-link master devices.

There is a need to provide a circuit that establishes an interface between an IO-link compatible master with an IO-link non-compatible slave. Specifically, there is a need for a circuit that interfaces between an IO-link master having an output stage using a push-pull circuit with a slave having a low side open collector switching transistor.

SUMMARY

According to an embodiment, an inverter circuit arrangement comprises: a first terminal, a second terminal, a terminal for a first supply potential and a terminal for a second supply potential; a pull-up resistor connected to the first terminal and to a terminal for the first supply potential; an AB class transistor circuit connected to the second terminal; a first current mirror having an input path connected to the terminal for the first supply potential and to one end of the AB class transistor circuit and having an output path connected to the first terminal; a second current mirror having an input path connected to the terminal for the second supply potential and to another end of the AB class transistor circuit and having an output path connected to the first terminal; a bias circuit comprising a bias current source, a terminal for a first bias voltage relative to the first potential and a terminal for a second bias voltage relative to the second supply potential, wherein the terminals for the first and second bias voltages are connected to the AB class transistor circuit; and a comparator connected to the first terminal having an output connected to the second terminal through a third current mirror.

The inverter circuit arrangement includes a first terminal OUT1 to be connected to the output terminal of the slave device. The slave device may include a low side switchable current source connected between the output terminal and the ground terminal. The low side current source may be an open collector NPN transistor. The inverter circuit arrangement includes a second terminal C/Q to be connected to the output terminal of the master device. The master device includes at least a high side switchable current source connected to the positive supply potential terminal and a low side switchable current source connected to the ground terminal in push-pull configuration. The inverter circuit arrangement fulfils the function of an interface circuit interfacing the signals and the logic behaviour between the IO-link master and the IO-link non-compatible slave. The circuit arrangement performs the function of a bidirectional inverter.

In more detail, the interface circuit includes a pull up resistor at the first terminal OUT1. The C/Q terminal is connected to an AB class transistor circuit, wherein the emitters of two complementary bipolar NPN and PNP transistors are connected to the C/Q terminal. The currents through the AB class transistors are fed back to the OUT1 terminal through corresponding current mirror circuits.

A bias circuit supplies respective bias voltages to the base terminals of the AB class transistors. The bias voltages are such that only one of the AB class transistors can be conductive. For example, the bias voltages are one or two diode potentials above or below the supply voltages. For the high side AB class transistor, the bias voltage is one or two diode potentials above ground potential. For the low side AB class transistor, the bias voltage is one or two diode potentials below the positive supply potential. The bias voltages are generated by a current source that produces a defined current that is mirrored by one or more current mirror circuits into paths that are either connected to ground or supply potential and that contain at least one diode. The diodes are connected to the base terminals of the AB class transistors. The AB class behaviour of the AB class transistors minimizes power consumption and the temperature impact generated by the power consumption of the device.

A comparator is provided at the OUT1 terminal. The comparator output supplies a current through a resistor that is mirrored into the terminal C/Q. The non-inverting input of the comparator is connected to the terminal OUT1 and the inverting input of the comparator is connected to a voltage divider that may generate a midpoint voltage such as the half of the supply voltage. If the signal at the terminal OUT1 is high, the output of the comparator is driven high, e.g. to supply potential, so that no output current is generated in the resistor. If the signal at the terminal OUT1 is low, the output of the comparator is driven low, e.g. to ground potential, so that a current is generated in the resistor that is mirrored into the terminal C/Q.

The bias circuit, in more detail, includes a bias current source connected to the positive supply potential that may be a resistor of a known, defined value so that it generates a corresponding current through a diode. The diode is the input path of a current mirror. Further current mirrors associated to one of the AB class transistors receive the bias current through additional current mirror circuits, wherein the AB class transistors form output paths of the associated current mirrors. The current mirror associated to the high side AB class transistor is connected to ground potential, and the current mirror associated to the low side AB class transistor is connected to the supply potential. The emitters of the input paths of said current mirrors may be directly connected to the ground and supply potentials, respectively, or through additional diode devices to generate bias voltages being one or more diode voltages above ground potential and below supply potential, respectively.

The current that is generated by the comparator output to be supplied to the terminal C/Q must be in a range that is defined by the currents of the master device. This current must be higher than the pull down current through the low side resistor of the master device. Furthermore, this current must be lower than the sum of the currents through the low side switch and through the low side pull down resistor of the master device. The appropriate amount of current can be determined by a resistor connected to the output of the comparator.

When connecting the inverter circuit arrangement according to an embodiment of the present disclosure between the output terminal of an IO-link compatible master and the output terminal of an IO-link non-compatible slave having a low side open collector NPN transistor as a low side switch, rather than an IO-link compatible high side switch, enables the non-compatible slave to cooperate with an IO-link master. The slave may be a sensor or an actuator. In particular, the slave may be an inductive proximity sensor of which the output may include a low side NPN transistor with a pull up resistor. The sensor may be a sensor with a high voltage default output. The device can communicate via the IO-link protocol using an NPN transistor at the device output. The inverter circuit arrangement may be included in the slave device or may be a separate printed circuit board arrangement connected to the output of the slave device.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Top Level Block Diagram

Figure 1:
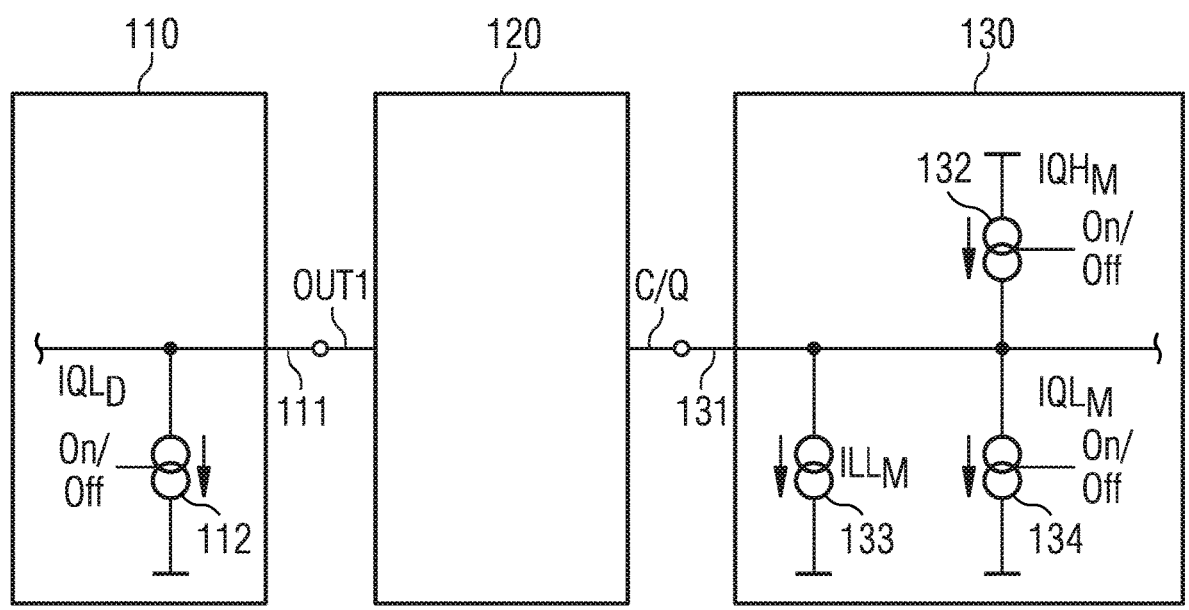
FIG. 1 shows a top level block diagram of a circuit according to the principles of the present disclosure.

The top level block diagram of FIG. 1 shows a master device 130 that includes an IO-link compatible output stage. The output terminal 131 is provided with a switchable high side current source 132 that supplies a current $IQH_M$ in response to a switching signal on/off. A low side current source 133 sinks a current $ILL_M$ from the terminal 131 to ground potential. The low side current source may be a resistor. Another switchable low side current source 134 sinks current $IQL_M$ in response to a switching signal on/off to ground potential. The switchable high side and low side current sources act in push-pull configuration and may be implemented with pnp and npn transistors, respectively.

A slave device 110 may be a sensor or an actuator. The slave device 110 may particularly be a proximity sensor. The proximity sensor includes a switchable low side current source 112 connected between output 111 and ground potential. The switchable current source 112 sinks a current $IQL_D$ in response to a switching signal on/off. The low side current source may be an open collector NPN transistor of which the collector is connected to output terminal 111 and the emitter is connected to ground potential. The base of the NPN transistor is controlled on or off representing the function of the slave device. Alternatively, the low side current source may be an open drain NMOS transistor.

Between terminals 111 and 131 there is provided an interface circuit 120 that matches the physical layer between the output terminals of the master 130 and the slave 110 that is between terminals 131 and 111. Interface circuit 120 is a bidirectional inverter that makes the IO-link master compatible with the slave that has a low side switch such as an open collector NPN transistor as output stage. Circuit 120 inverts the master input/output current at terminal C/Q to the terminal OUT1 for the slave input/output and at the same time limits the C/Q voltage range with class A/B transistor current comparators. These comparators switch off the appropriate current from the high side or the low side depending on the C/Q current polarity. With the correct dimensioning of the currents as explained in more detail below, the circuit is also able to override the master pull down current at terminal C/Q when terminal OUT1 is being driven low. At the idle state, the interface circuit provides a pull up resistor at the terminal OUT1 so that the terminal OUT1 is kept at a logical "1" and the master pull down current keeps the terminal C/Q at "0".

Detailed Schematics of Inverter Circuit

Figure 2:
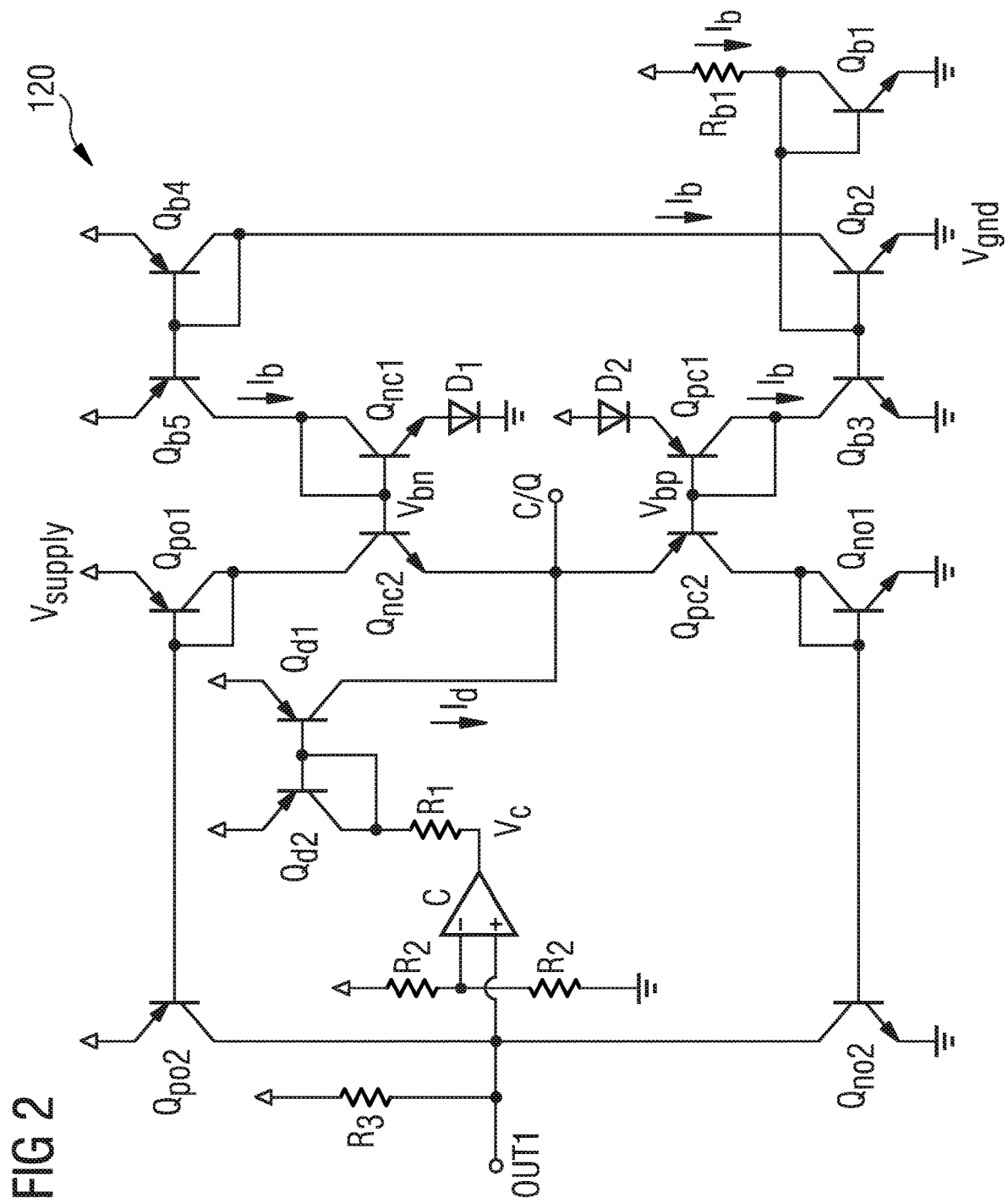
FIG. 2 shows a detailed schematic diagram of the inverter circuit connected between the slave and the master of the arrangement of FIG. 1.

The detailed structure of circuit 120 is depicted in FIG. 2. The schematics of circuit 120 include a pull up resistor $R_3$ connected to the terminal OUT1 and the terminal for the positive supply potential $V_{supply}$. In an example, the positive supply potential $V_{supply}$ may be 24 V and the resistor $R_3$ may be in the range of 200Ω. The terminal C/Q of circuit 120 is connected to AB class transistors $Q_{nc2}$ and $Q_{pc2}$. The emitter of NPN transistors $Q_{nc2}$ is connected to the emitter of PNP transistor $Q_{pc2}$ and to terminal C/Q. The collectors of transistors $Q_{nc2}$ and $Q_{pc2}$ are connected to corresponding current mirrors that replicate the current through these transistors to the terminal OUT1. Specifically, PNP transistor $Q_{po1}$ is connected between the collector of NPN transistor $Q_{nc2}$ and supply potential $V_{supply}$. Transistor $Q_{po1}$ is configured as a diode and is connected to the output path of the current mirror including PNP transistor $Q_{po2}$ of which the collector is connected to the terminal OUT1. NPN transistor $Q_{no1}$ is connected to the collector of PNP transistor $Q_{pc2}$ and to ground potential $V_{gnd}$. Transistor $Q_{no1}$ is configured as a diode and replicates the current to the output path of the current mirror that includes NPN transistor $Q_{no2}$ connected between the terminal OUT1 and ground potential $V_{gnd}$.

A bias circuit illustrated at the right-hand side of the schematic diagram includes a current source connected to supply potential $V_{supply}$ in the form of a resistor $R_{b1}$ supplying current $I_b$. The current $I_b$ flows through diode connected transistor $Q_{b1}$ that replicates the current into a current mirror arrangement which is connected between supply potential $V_{supply}$ and ground potential $V_{gnd}$. This current mirror arrangement includes a high side current mirror and a low side current mirror. The high side current mirror includes diode connected PNP transistor $Q_{b4}$ and an output PNP transistor $Q_{b5}$, both transistors connected to supply potential $V_{supply}$. The low side current mirror includes NPN transistor $Q_{b2}$ and NPN transistor $Q_{b3}$ of which the bases are connected together and are connected to current source transistor $Q_{b1}$, all transistors connected to ground potential $V_{gnd}$. As a result, the current $I_b$ also flows through transistors $Q_{b5}$ and $Q_{b3}$.

Further connected to transistor $Q_{b5}$ is another current mirror including NPN transistor $Q_{nc1}$ configured as a diode of which the emitter is connected through diode $D_1$ to ground potential $V_{gnd}$. The output side of this current mirror includes the high side AB class transistor $Q_{nc2}$. The common bases of transistors $Q_{nc1}$, $Q_{nc2}$ carry bias potential $V_{bn}$. At the low side portion, transistor $Q_{b3}$ is connected to another current mirror including PNP transistor $Q_{pc1}$ configured as a diode of which the emitter is connected through diode $D_2$ to supply potential $V_{supply}$. The output side of this current mirror includes the low side AB class transistor $Q_{pc2}$. The common bases of transistors $Q_{pc1}$, $Q_{pc2}$ carry bias potential $V_{bp}$. The bias potentials $V_{bn}$, $V_{bp}$ are fixed at two diode voltages relative to the ground potential $V_{gnd}$ and the supply potential $V_{supply}$, resp. The diodes $D_1$, $D_2$ may be omitted so that the bias voltages $V_{bn}$, $V_{bp}$ are fixed at one diode voltage above or below potentials $V_{gnd}$, $V_{supply}$.

A feedback path between terminals OUT1 and C/Q includes a comparator C. The non-inverting input "+" of comparator C is connected to the terminal OUT1. The inverting input "−" of comparator C is connected to a voltage divider which is connected between supply voltage $V_{supply}$ and ground potential $V_{gnd}$. The voltage divider is symmetrical in that it includes two identical resistors $R_2$ of which the midpoint is connected to the inverting input of comparator C. The voltage divider supplies a threshold voltage to the comparator to which the voltage at terminal OUT1 is compared. The output of comparator C is connected to a resistor $R_1$ which is a portion of a current mirror circuit comprising diode connected PNP transistor $Q_{d2}$ and output PNP transistor $Q_{d1}$. The emitters of transistors $Q_{d2}$, $Q_{d1}$ are connected to supply potential $V_{supply}$. The collector of transistor $Q_{d1}$ is connected to the terminal C/Q and supplies current $I_d$.

Resistors may be provided (not shown in the drawings) between the collectors of transistors $Q_{b4}$, $Q_{b2}$ and between the collectors of transistors $Q_{no1}$, $Q_{pc2}$ and $Q_{po1}$, $Q_{nc2}$. These resistors reduce the respective collector voltages.

Operation of Inverter Circuit

The operation of the circuit depicted in FIG. 2 is as follows. The transistor $Q_{b1}$ and the resistor $R_{b1}$ define the bias current $I_b$ which is used to biase the current comparators at the terminal C/Q. The current mirror formed by transistors $Q_{b1}$, $Q_{b2}$ and $Q_{b3}$ and the current mirror formed by transistors $Q_{b4}$ and $Q_{b5}$ replicate this current through transistors $Q_{pc1}$ and $Q_{nc1}$.

The current $I_b$ through diode $D_1$ and transistor $Q_{nc1}$ defines the potential $V_{bn}$ and the current $I_b$ through diode $D_2$ and transistor $Q_{pc1}$ defines the potential $V_{bp}$. A current can flow through transistor $Q_{nc2}$ only if the voltage at terminal C/Q is below $V_{bn}$−$Vbe_{nc2}$ ($Vbe_{nc2}$: base emitter voltage of transistor $Q_{nc2}$). A current can flow through transistor $Q_{pc2}$ only if the voltage at terminal C/Q is above $V_{bp}$+$Veb_{pc2}$ ($Vbe_{pc2}$: base emitter voltage of transistor $Q_{pc2}$). So, no current can flow simultaneously through both transistors $Q_{nc2}$ and $Q_{pc2}$, achieving the class AB behavior. A quiescent current from supply to ground through these transistors is avoided.

The comparator C compares the voltage at terminal OUT1 with half of the supply voltage $V_{supply}/2$. If the voltage at terminal OUT1 is above this threshold, the output voltage of comparator C is set as $V_C=V_{supply}$ so that there is no current through resistor $R_1$. If the voltage at terminal OUT1 is below that threshold, the output voltage of comparator C is set as $V_C=V_{gnd}$ so that the current through resistor R1 is injected at terminal C/Q by current the current mirror of transistors $Q_{d1}$ and $Q_{d2}$. The current through resistor $R_1$ is $$I_d=(V_{supply}-Vbe_{d2}-V_C)/R_1,$$

when the potential at terminal OUT1 is low. The current $I_d=0$, when the potential at terminal OUT1 is high. The function of comparator C can be summarized as follows:

$$\text{OUT1}=H, \ V_C=V_{supply}, \ I_d=0$$

$$\text{OUT1}=L, \ V_C=V_{gnd}, \ I_d=(V_{supply}-Vbe_{d2}-V_C)/R_1$$

The IO-link master pulls down the potential at terminal C/Q with the current $ILL_M$. At idle state, there is no other current generated by the master nor by the slave. So, the terminal C/Q is pulled down low and the current $ILL_M$ flows through transistor $Q_{nc2}$. This current is replicated by current mirror of transistors $Q_{po1}$ and $Q_{po2}$ at the terminal OUT1 so that the potential at terminal OUT1 is pulled up. In order to avoid that terminal OUT1 floats and becomes low, current $I_d$ is injected at terminal C/Q higher than current $ILL_M$ so that the current through resistor $R_3$ pulls up terminal OUT1 also.

When the master wants to transmit a bit "1" after the idle state (start bit) or after a previous bit "0", it pulls up terminal C/Q with current $IQH_M$, higher than current $ILL_M$. The differential current $IQH_M$−$ILL_M$ flows through transistor $Q_{pc2}$ and it is replicated by current mirror of transistors $Q_{no1}$ and $Q_{no2}$ at terminal OUT1. The differential current $IQH_M$−$ILL_M$ must be higher than the current through resistor $R_3$ which is $V_{supply}/R_3$, so that the master can turn terminal OUT1 low. When terminal OUT1 is low, the current Id is also injected at terminal C/Q, which enforces the pulling up of the terminal C/Q.

When the master wants to transmit a bit "0" after a previous bit "1", terminal C/Q is pulled down with current $IQL_M$. Current $ILL_M$ also pulls down the terminal C/Q, while current $I_d$ pulls the terminal C/Q up. The current $IQL_M$+$ILL_M$−$I_d$ (higher than 0) flows through transistor $Q_{nc2}$ and it is replicated by current mirror of transistors $Q_{po1}$ and $Q_{po2}$ at terminal OUT1 pulling up the terminal OUT1 with the help of resistor $R_3$. At the moment when terminal OUT1 is high, current $I_d$ turns to zero and the final current through transistor $Q_{nc2}$ is $IQL_M$+$ILL_M$.

When the master stops transmitting after the stop bit, which is a bit "1", terminal C/Q is pulled down by current $ILL_M$. Current $I_d$ is activated as previously terminal C/Q was pulled up. As current $I_d$ is higher than current $ILL_M$, terminal C/Q is not pulled down until terminal OUT1 is turned high by resistor $R_3$.

When the slave device wants to transmit a bit "1" at terminal C/Q after a previous idle state or previous bit "0", the open drain NPN transistor at its output stage should be connected, pulling down terminal OUT1. Current $I_1$ appears and terminal C/Q is pulled up as current $I_d$ is higher than current $ILL_M$.

When the slave device wants to transmit "0" at terminal C/Q from previous bit "1" or to come back to idle state, the open drain NPN transistor is disconnected and terminal OUT1 is pulled up by resistor $R_3$. At the moment OUT1 is high, current $I_d$ is zero and current $ILL_M$ is able to pull down terminal C/Q.

So, for current $I_d$ the constraint is that it should be higher than current $ILL_M$ and smaller than current $IQL_M + ILL_M$.

The inverter circuit 120 inverts currents and voltages between the IO-link master and other devices that are not able to generate a high quiescent current to pull up the voltage of the signal line. With use of the inverter circuit 120 such slave devices are able to communicate using the IO-link protocol even at maximum speed.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirt and substance of the disclosure may occur to the persons skilled in the art, the disclosure should be construed to include everything within the scope of the appended claims.

The invention claimed is:

1. An inverter circuit arrangement, comprising:
   a first terminal, a second terminal, a terminal for a first supply potential and a terminal for a second supply potential;
   a pull-up resistor connected to the first terminal and to the terminal for the first supply potential;
   an AB class transistor circuit connected to the second terminal;
   a first current mirror having an input path connected to the terminal for the first supply potential and to one end of the AB class transistor circuit and having an output path connected to the first terminal;
   a second current mirror having an input path connected to the terminal for the second supply potential and to another end of the AB class transistor circuit and having an output path connected to the first terminal;
   a bias circuit comprising a bias current source to provide a bias current, a current mirror configured to receive the bias current and having an output path that includes a transistor of the AB class transistor circuit and having an input path that includes a diode connected to the terminal for the first supply potential and a transistor configured as a diode connected to the control terminal of the transistor of the AB class transistor circuit;
   another current mirror configured to receive the bias current and having an output path that includes another transistor of the AB class transistor circuit and having an input path that includes a diode connected to the terminal for the second supply potential and a transistor configured as a diode connected to the control terminal of the other transistor of the AB class transistor circuit; and
   a comparator connected to the first terminal having an output connected to the second terminal through a third current mirror.

2. The inverter circuit arrangement according to claim 1, further comprising a master circuit having an output terminal connected to the second terminal, the master circuit comprising a first switchable current source connected to the output terminal of the master circuit and the terminal for the second supply potential, a second current source connected to the output terminal of the master circuit and the terminal for the second supply potential and a third switchable current source connected to the output terminal of the master circuit and the terminal for the first supply potential.

3. The inverter circuit arrangement according to claim 2, further comprising a slave circuit having an output terminal connected to the first terminal, the slave circuit comprising a switchable current source connected to the terminal for the second supply potential and to the output terminal of the slave circuit.

4. The inverter circuit arrangement according to claim 3, wherein the terminal for the first supply potential is a terminal for a positive potential and the terminal for the second supply potential is a terminal for a ground potential, wherein current mirrors connected to the terminal for the positive potential include PNP transistors and current mirrors connected to the terminal for the ground potential include NPN transistors.

5. The inverter circuit arrangement according to claim 3, wherein the slave circuit includes an open collector driver transistor of which the collector is connected to the first terminal and the emitter is connected to the terminal for the second supply potential.

6. The inverter circuit arrangement according to claim 3, wherein the master circuit comprises an output stage that complies with European Norm EN 61131 part 9 and the slave circuit comprises an output stage that does not comply with European Norm EN 61131 part 9.

7. The inverter circuit arrangement according to claim 3, wherein the circuit is configured such that a current supplied by the output of the comparator is higher than the current supplied by the second current source of the master circuit and smaller than the sum of currents supplied by the first switchable current source of the master circuit and the second current source of the master circuit.

8. The inverter circuit arrangement according to claim 1, wherein the AB class transistor circuit comprises a PNP transistor and a NPN transistor, of which the emittors are connected to the second terminal.

9. The inverter circuit arrangement according to claim 1, wherein the comparator comprises a first input that is connected to a threshold voltage and a second input connected to the first terminal, wherein the output of the comparator is connected to a resistor, wherein the third current mirror comprises an input path connected to the resistor and an output path connected to the second terminal.

10. The inverter circuit arrangement according to claim 9, wherein the first input of the comparator is an inverting input that is connected to a voltage divider and the second input of the comparator is a non-inverting input connected to the first terminal.

11. The inverter circuit arrangement according to claim 1, wherein the second terminal is configured to be connected to an output terminal of a master circuit, the master circuit comprising a first switchable current source connected to the output terminal of the master circuit and the terminal for the second supply potential, a second current source connected to the output terminal of the master circuit and the terminal for the second supply potential and a third switchable current source connected to the output terminal of the master circuit and the terminal for the first supply potential.

12. The inverter circuit arrangement according to claim 11,
wherein the first terminal is configured to be connected to an output terminal of a slave circuit, the slave circuit comprising a switchable current source connected to the terminal for the second supply potential and to the output terminal of the slave circuit.

* * * * *